United States Patent
Piombo et al.

(10) Patent No.: US 9,575,100 B2
(45) Date of Patent: Feb. 21, 2017

(54) CIRCUIT ARRANGEMENT AND METHOD FOR DETERMINING A CURRENT IN A CIRCUIT ARRANGEMENT

(71) Applicant: Infineon Technologies Austria AG, Villach (AT)

(72) Inventors: Davide Piombo, Genoa (IT); Angelo Cavo, Novi Ligure (IT); Fabio Parodi, Genoa (IT); Davide Flamini, Monza (IT); Wolfgang Meier, Soquel, CA (US); Sergio Rossi, Taufkirchen (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 952 days.

(21) Appl. No.: 13/838,162

(22) Filed: Mar. 15, 2013

(65) Prior Publication Data

US 2014/0278175 A1    Sep. 18, 2014

(51) Int. Cl.
*G01R 19/22*    (2006.01)
*G01R 21/133*   (2006.01)

(52) U.S. Cl.
CPC ........... *G01R 19/22* (2013.01); *G01R 21/133* (2013.01)

(58) Field of Classification Search
CPC .... G01R 19/22; G01R 19/0092; G01R 19/00; G01R 19/02; G01R 21/133; G01R 21/1331; G01R 21/006; G01R 21/06
See application file for complete search history.

(56) References Cited

U.S. PATENT DOCUMENTS

| 5,515,261 A * | 5/1996 | Bogdan | H02M 1/4225 323/222 |
| 2012/0112727 A1* | 5/2012 | Motohashi | G01R 19/25 323/304 |
| 2014/0125346 A1* | 5/2014 | Barfield | G01R 19/00 324/426 |

* cited by examiner

*Primary Examiner* — Manuel L Barbee
(74) *Attorney, Agent, or Firm* — Viering, Jentschura & Partner mbB (57) ABSTRACT

A circuit arrangement including a rectifier circuit and a current determining circuit. The rectifier circuit is configured to rectify an alternating signal into a rectified signal. The current determining circuit is configured to determine a current of the alternating signal from at least a current of the rectified signal.

19 Claims, 3 Drawing Sheets

CIRCUIT ARRANGEMENT AND METHOD FOR DETERMINING A CURRENT IN A CIRCUIT ARRANGEMENT

TECHNICAL FIELD

Various embodiments relate generally to a circuit arrangement and a method for determining a current in a circuit arrangement.

BACKGROUND

The power and the power quality of a circuit arrangement may be determined by measuring the input current and the input voltage. The sensor or the measurement circuit for measuring the input current may need to be isolated, for example for safety reasons, for example by using a coil transformer. However, using a coil transformer may be undesirable as it consumes space and increase the system cost.

As an alternative, the output current and the output voltage may be measured. However, errors are introduced when calculating the power and the power quality of the circuit arrangement based on these measurements. The errors may be particularly large when light loads are connected to the output of the circuit arrangement. For example, the error in calculating the active power may be between 5% to 15%.

SUMMARY

Various embodiments relate to an accurate and cost-effective way of measuring power and metrics related to power quality. A circuit arrangement is provided, including a rectifier circuit and a current determining circuit. The rectifier circuit may be configured to rectify an alternating signal into a rectified signal. The current determining circuit may be configured to determine a current of the alternating signal from at least a current of the rectified signal.

In an embodiment, the current determining circuit may be configured to measure a voltage across at least one electronic device in the circuit arrangement and may be configured to determine a current flowing through the electronic device using the measured voltage across the electronic device and a model of the electronic device.

In an embodiment, the current determining circuit may be configured to determine the current of the alternating signal according to Kirchhoff's current law applied to the current flowing through the at least one electronic device and the current of the rectified signal.

In an embodiment, the at least one electronic device may include a filter to suppress electromagnetic interference between the alternating signal and the rectified signal.

In an embodiment, the at least one electronic device may include a capacitor to smoothen the rectified signal.

In an embodiment, the rectifier circuit may be configured as a full-wave rectifier.

An embodiment may further include a voltage measuring circuit configured to measure a voltage of the alternating signal.

In an embodiment the current determining circuit may include a programmable logic circuit.

In an embodiment, the current determining circuit may be configured to calculate at least one of: an active power of the alternating signal, a reactive power of the alternating signal, an apparent power of the alternating signal, a power factor of the alternating signal, a phase angle of the alternating signal, a voltage root mean square of the alternating signal, a current root mean square of the alternating signal, a crest factor of the alternating signal, a distortion power of the alternating signal, a harmonic content of voltage of the alternating signal, a harmonic content of current of the alternating signal, and a total harmonic distortion of the alternating signal.

An embodiment may further include a power factor correction circuit configured to provide a power factor correction.

Further, a use of the circuit arrangement may be provided for power factor correction, e.g. for power factor correction in a power supply.

There may further be provided a method for determining a current in a circuit arrangement, the method including: rectifying an alternating signal into a rectified signal, determining a current associated with the rectified signal, and determining an alternating current by using a circuit topology of the circuit arrangement and the current associated with the rectified signal.

In an embodiment, determining the alternating current using circuit topology may include applying Kirchhoff's current law to the circuit arrangement.

In an embodiment, applying Kirchhoff's current law may include measuring a voltage over at least one electronic device and determining a current through the electronic device based on a device model and the measured voltage over the electronic device.

In an embodiment, the current through the electronic device may be determined by means of a programmable logic circuit.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced. The word "exemplary" is used herein to mean "serving as an example, instance, or illustration". Any embodiment or design described herein as "exemplary" is not necessarily to be construed as preferred or advantageous over other embodiments or designs.

Figure 1:
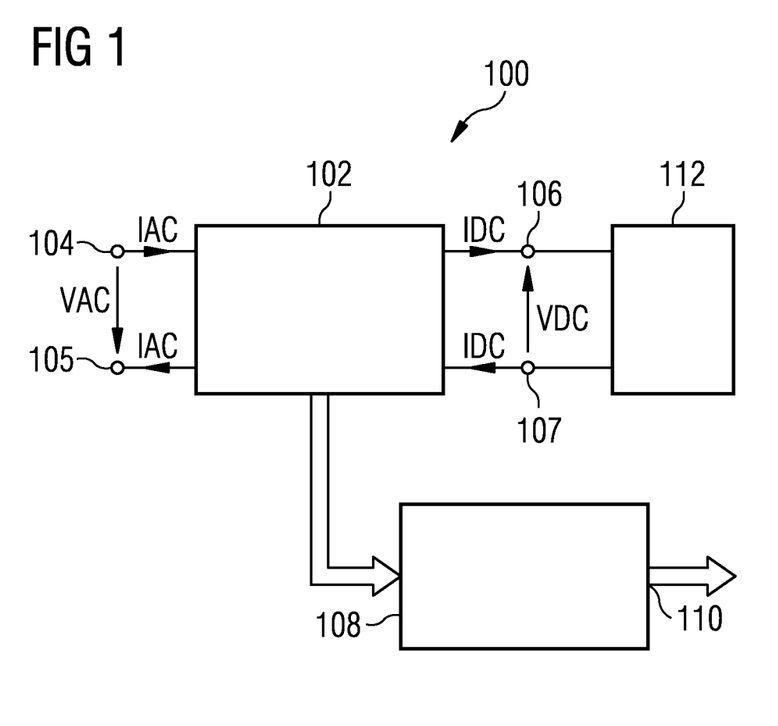
FIG. 1 shows an embodiment of a circuit arrangement.

FIG. 1 shows an embodiment of a circuit arrangement 100. The circuit arrangement 100 may include a rectifier circuit 102, a current determining circuit 108 and a power factor correcting circuit 112.

The rectifier circuit 102 may have inputs 104 and 105 and outputs 106 and 107. The rectifier circuit 102 may be configured to rectify an alternating signal applied at the inputs 104 and 105 into a rectified signal at the outputs 106 and 107. The alternating signal may have a current IAC and a voltage VAC. The alternating signal may be a line signal or mains signal. The rectified signal may have a current IDC and a voltage VDC. The rectified signal may have a single polarity.

The current determining circuit 108 may be configured to determine the current IAC of the alternating signal from at least the current IDC of the rectified signal. To do this, the current determining circuit 108 may be connected to the rectifier circuit 102. The current determining circuit 108 may be configured to measure a voltage across at least one electronic device in the circuit arrangement 100, for example in the rectifier circuit 102 or the power factor correcting circuit 112, or in both. It may determine a current flowing through the electronic device using a voltage measured across the electronic device and a model of the electronic device. A model of the electronic device may relate a current flowing through the electronic device to a voltage across the electronic device.

A model may be based on an equivalent circuit of the electronic device. For example, a model of a capacitor may be $$IC(t)=C*d(VC)/dt, \tag{1}$$

where IC(t) designates the current flowing through the capacitor, VC(t) designates the voltage across the capacitor, for example the voltage across the terminals of the capacitor, C designates the capacitance of the capacitor, t represents time, and d(VC)/dt designates the derivate of the voltage across the capacitor with respect to time t.

For example, a model of a resistor may be $$IR=VR/R, \tag{2}$$

where IR designates the current through the resistor, VR designates the voltage across the resistor, and R designates the resistance of the resistor.

The models may be further refined by modeling non-ideal behavior. For example, components for equivalent series or parallel resistance, equivalent series or parallel inductance and equivalent series or parallel capacitance may be included to model leakage current, dielectric loss, inductance of leads and other parasitic effects. Further refining may, for example, include frequency dependence, temperature dependence, aging and other parameters.

Parameters of the model, for example a resistance, a capacitance or an inductance or other values used to describe the electronic devices, may be determined using corresponding measurements. The parameters of the models may, for example, be determined by measuring a voltage across the terminals of the electronic device and a current flowing through the electronic device. Depending on the model, the measured voltage and current may be further processed in order to calculate the parameter. For example, a derivative or an integral of a voltage or a current may be determined.

The parameters of the models may be stored in a memory, for example, in a non-volatile memory, that the parameters do not need to be determined every time the circuit arrangement 100 is operated.

Alternatively, the model of the electronic device may be in the form of a table. The table may store for each voltage value a corresponding current value. The current flowing through the electronic device for a voltage measured across the electronic device may be looked up in the table. Using a look-up-table (LUT) may reduce the complexity of calculation necessary for determining the current.

The current determining circuit 108 may be configured to determine the current IAC of the alternating signal according to Kirchhoff's current law applied to the at least one electronic device and the current IDC of the rectified signal. Kirchhoff's current law, also known as Kirchhoff's first law, Kirchhoff's point rule, or Kirchhoff's junction rule, states that at any node or junction in an electrical circuit arrangement, the sum of currents flowing into that node is equal to the sum of currents flowing out of that node. Information about the topology of the circuit arrangement, for example the rectifier circuit 102, may be used in the current determining circuit 108 when applying Kirchhoff's current law. The topology of a circuit arrangement 100 may be described by nodes and electric devices connected between the nodes. The current IAC may be determined or calculated by applying Kirchhoff's current law to one or more nodes of the circuit arrangement 100, for example in the rectifier circuit 102, to which the at least one electronic device is connected and from the current IDC of the rectified signal entering or leaving a node.

The current determining circuit 108 may have an output 110. Information about the current IAC of the alternating signal which is determined by the current determining circuit 108 may be output at the output 110. Additional information, for example information concerning power metrics, such as an active power, a reactive power, an apparent power, a power factor, a phase angle, a voltage root mean square, a current root mean square, a crest factor, a distortion power, a harmonic content of voltage, a harmonic content of current, and a total harmonic distortion may also be determined by the current determining circuit 108 and be provided at the output 110. The information may relate to the alternating signal at the inputs 104 and 105.

The power factor is the ratio of the active power P to the apparent power S. A power factor of 1 indicates that all of the apparent power S is active power P. A power factor of 0 indicates that none of the apparent power is active power P, or in other words, that all of the apparent power S is reactive power Q. The power factor correcting circuit 112 may supply reactive power Q of an opposite sign to the reactive power Q of the alternating signal in order to bring the power factor of the circuit arrangement 100 closer to 1. The power factor may be corrected automatically. The power factor correcting circuit 112 may be optional.

For a linear load, the power factor correcting circuit 112 may be passive. One or more capacitors may be used to cancel an inductive load. One or more inductors may be used to cancel a capacitive load. The capacitors or the inductors may be added until the power factor of the circuit arrangement 100 determined by the current determining circuit 108 reaches unity.

For a non-linear load, for example a switched-mode power supply, the input current IAC may be highly non-linear and have energy at harmonics. A low pass filter may be used to reduce the harmonic content to achieve a linear load. However, such a filter requires bulky and expensive large-value high-current inductors. An active power factor correcting circuit 112, such as a boost, buck, or buck-boost converter may be used. A sinusoidal input current may be achieved by a control circuit that uses the voltage waveform as a template. The control circuit may measure the rectified input current, compare it to the rectified input voltage waveform, and adjust the boost voltage to produce an input current waveform of the same shape and in phase with the input voltage. As a consequence, the current and the voltage may appear purely resistive and the reactive power Q consumption is zero. At the same time, the control circuit may monitor a bus voltage of the boost, buck, or buck-boost converter, and adjust the boost voltage to maintain a closely regulated DC output bus voltage. If the peak value of the rectified signal is less than the bus voltage, no current will flow into a smoothing capacitor of the boost, buck, or buck-boost converter, so that the control circuit may adjust the boost voltage to maintain a sinusoidal input current.

The circuit arrangement 100 may be used for power factor correction in a power supply, e.g. in switched-mode (or switching-mode) power supply (SMPS), used for example in personal computers (PCs) or the like.

Besides the power factor correcting circuit 112, the circuit arrangement 100 may have another boost converter, buck converter, or buck-boost converter for generating the voltage to be output by the switched-mode power supply.

Figure 2:
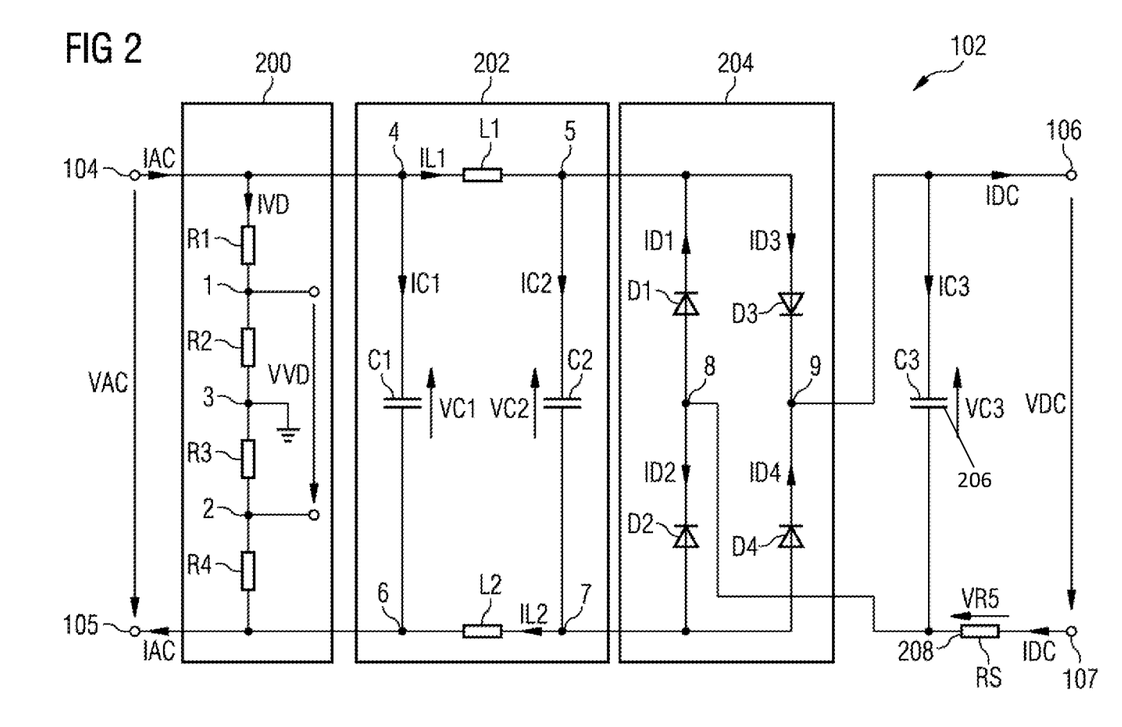
FIG. 2 shows an embodiment of a rectifier circuit.

FIG. 2 shows an embodiment of a rectifier circuit 102. The rectifier circuit 102 may have a voltage divider 200, a filter 202, a rectifier 204, a capacitor 206 and a resistor 208.

The voltage divider 200 may be a voltage measuring circuit. It may be used to measure the voltage VAC of the alternating signal between the inputs 104 and 105. The voltage VAC of the alternating signal may be necessary for determining some of the power metrics listed above, for example the apparent power.

The voltage divider 200 may have a first resistor R1, a second resistor R2, a third resistor R3 and a fourth resister R4 connected in series to each other and between the inputs 104 and 105. One of the terminals of the first resistor R1 may be connected to input 104 and one of the terminals of the fourth resistor may be connected to the other input 105. The other of the terminals of the first resistor R1 may be connected to one terminal of the second resistor R2 and may form a first node 1. The other of the terminals of the fourth resistor R4 may be connected to one of the terminals of the third resistor R3 and may form a second node 2. The other of the terminals of the second resistor R2 and the other terminal of the third resistor R3 may be connected to each other and to a ground potential.

A voltage VVD may be measured between the first node 1 and the second node 2. If the resistance of R1 and R4 is equal (R1=R4) and the resistance of R2 and R3 is equal (R2=R3), the voltage VAC may be calculated by $$VAC=KVD*VVD \tag{3}$$

with $$KVD=(R1+R2)/R2. \tag{4}$$

A current IVD may flow through the voltage divider 200. If the resistance of R1 and R4 is equal (R1=R4) and the resistance of R2 and R3 is equal (R2=R3), the current IVD may be calculated by $$IVD=VVD/(2*R2). \tag{5}$$

The values of R1, R2, R3 and R4 may be chosen to reduce the voltage to be measured, e.g. to a value that is a safe value for human beings and that may be easily measured. For example, if VAC=230 V, R1=R4=940k and R2=R3=4k7, then KVD=201 and VVD=1.14 V. Further, the voltage divider may be dimensioned so as to reduce the current flowing through it. For the above mentioned values, IVD=1.14 V/(2*4.7k)=0.122 mA. The current flowing through the voltage divider 200 may be negligible when determining the current IAC and there may be no need for determining it.

The voltage divider 200 may also be implemented in other ways. The voltage divider 200 may be optional, for example, if it is desired to measure VAC directly.

The filter 202 may be an electromagnetic interference (EMI) filter. The filter 202 may be configured to suppress electromagnetic interference between the alternating signal and the rectified signal. A first inductor L1 may be connected between a fourth node 4 and a fifth node 5. A current IL1 may flow through the inductor L1 from the fourth node 4 to the fifth node 5. The fourth node 4 may be connected to input 104. A second inductor L2 may be connected between a sixth node 6 and a seventh node 7. A current IL2 may flow through the second inductor L2 from the seventh node 7 to the sixth node 6. The sixth node 6 may be connected to the other input 105.

A first capacitor C1 may be connected between the fourth node 4 and the sixth node 6. The first capacitor C1 may have voltage VC1 across its terminals. A current IC1 may flow through the first capacitor C1 from the fourth node 4 to the sixth node 6. If the capacitance C1 is known, the current IC1 may be calculated from $$IC1=C1*d(VC1)/dt, \tag{6}$$

with d(VC1)/dt being the derivative of the voltage VC1 with respect to time t.

A second capacitance C2 may be connected between the fifth node 5 and the seventh node 7. The second capacitor C2 may have a voltage VC2 across its terminals. A current IC2 may flow through the second capacitor C2 from the fifth node 5 to the seventh node 7. If the capacitance C2 is known, the current IC2 may be calculated from $$IC2=C2*d(VC2)/dt, \tag{7}$$

with d(VC2)/dt being the derivative of the voltage VC2 over time t.

The filter 202 may be constructed differently. It may have a low pass design, for example, with a combination of shunting capacitors and series inductors. It may impede the flow of high frequency signals, for example, harmonics, by effectively shorting them. The filter 202 may be optional.

The rectifier 204 may rectify an alternating signal into a rectified signal. It may be a full-wave rectifier or a half-wave rectifier. A full-wave rectifier may have a first diode D1, a second diode D2, a third diode D3 and a fourth diode D4. One terminal of the first diode D1 may be connected to the fifth node 5 and the other terminal of the first diode D1 may be connected to an eighth node 8. The first diode D1 may conduct a current ID1 from the eighth node 8 to the fifth node 5 and may block current from the fifth node 5 to the eighth node 8. One terminal of the second diode D2 may be connected to the seventh node 7 and the other terminal of the second diode D2 may be connected to the eighth node 8. The second diode D2 may conduct a current ID2 from the eighth node 8 to the seventh node 7 and may block current from the seventh node 7 to the eighth node 8. One terminal of the third diode D3 may be connected to the fifth node 5 and the other terminal of the third diode D3 may be connected to a ninth node 9. The third diode D3 may conduct a current ID3 from the fifth node 5 to the ninth node 9 and may block current from the ninth node 9 to the fifth node 5. One terminal of the fourth diode D4 may be connected to the ninth node 9 and the other terminal of the fourth diode D4 may be connected to the seventh node 7. The fourth diode D4 may conduct a current ID4 from the seventh node 7 to the ninth node 9 and may block current from the ninth node 9 to the seventh node 7. An alternating signal may be applied to the fifth node 5 and the seventh node 7 and will be rectified into a rectified signal that may be output between the eighth node 8 and the ninth node 9.

The capacitor 206 may have a capacitance C3 and may be connected between the eighth node 8 and the nineth node 9. It may smoothen the rectified signal provided between the eighth node 8 and the nineth node 9. The capacitor 206 may have a current IC3 flowing through it from the ninth node 9 to the eighth node 8. The capacitor 206 may have a voltage VC3 across it. If the capacitance C3 is known, the current IC3 may be calculated from $$IC3 = C3 * d(VC3)/dt, \quad (8)$$

with d(VC3)/dt being the derivative of the voltage VC3 over time t.

The resistor 208 may have a resistance R5 and may be connected between output 107 and the eighth node 8. Alternatively, the resistor 208 may be connected between output 106 and the nineth node 9. The resistor 208 may be a sense resistor, preferably a current sense resistor. It may have a current IDC flowing through it. It may have a voltage VR5 across its terminals. If its resistance R5 is known, the current IDC flowing through it may be calculated from the voltage VR5

$$IR5 = VR5/R5. \quad (9)$$

The current IR5 may be equal to the rectified current IDC $$IDC = IR5, \quad (10)$$

so that IDC may be determined from IR5.

Figure 3:
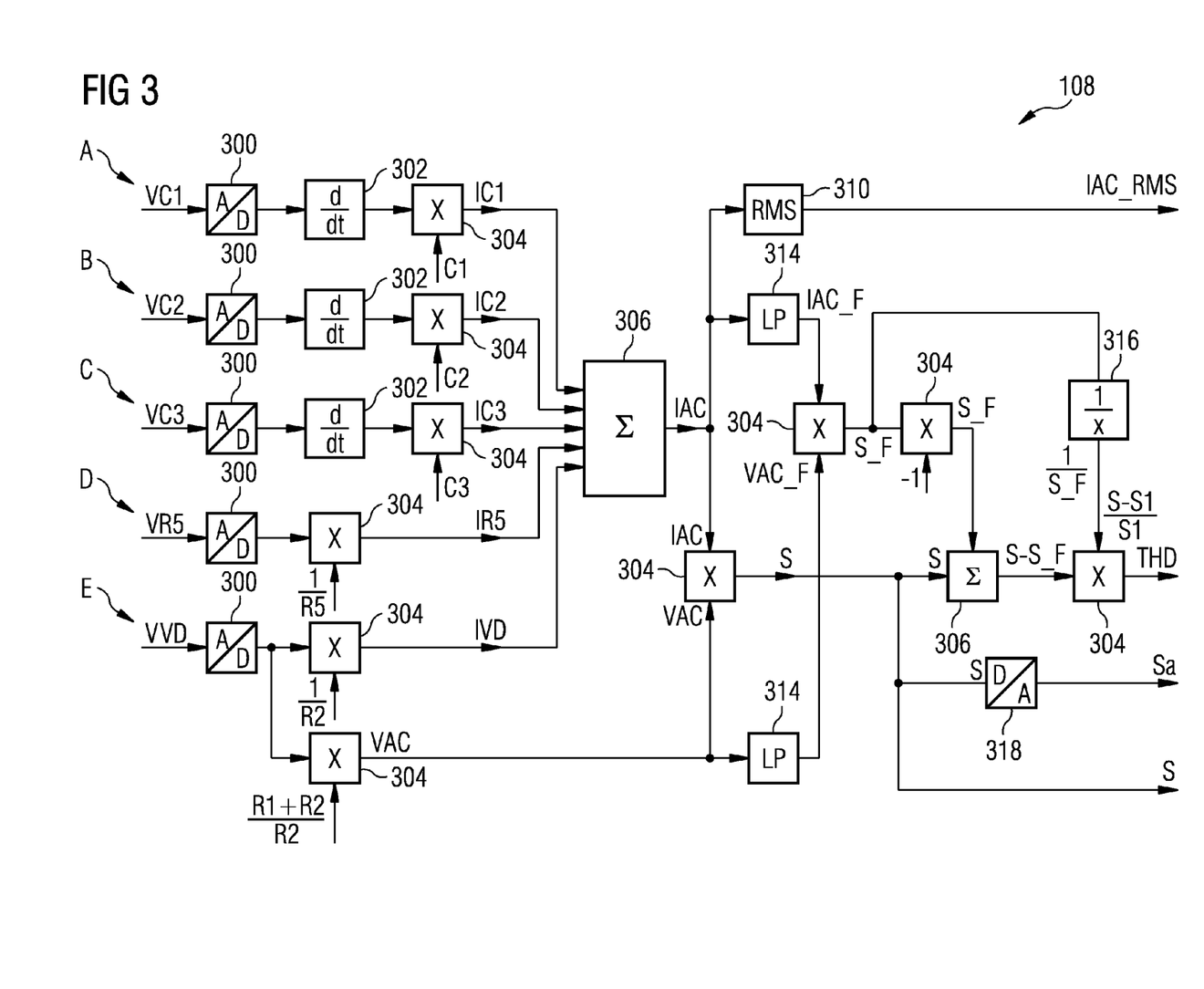
FIG. 3 shows an embodiment of a current determining circuit.

FIG. 3 shows an embodiment of a current determining circuit 108. The current determining circuit 108 may be configured to measure a voltage across at least one electronic device in the circuit arrangement 100. The at least one electronic device may be in at least one of the rectifier circuit 102, the current determining circuit 108 and the power factor correcting circuit 112. For example, the current determining circuit 108 may be configured to measure the voltages VC1, VC2, VC3, VR5 and VVD across the first capacitor C1, the second capacitor C2, the third capacitor C3, the resistor R5 and the voltage divider 200 shown in FIG. 2, respectively. It may be configured to measure any voltage that is necessary for determining the current IAC of the alternating signal.

The current determining circuit 108 may be configured to determine a current flowing through the electronic device using the measured voltage across the electronic device and a model of the electronic device. For example, it may be configured to determine the currents IC1, IC2, IC3, IR5 and IVD flowing through the first capacitor C1, the second capacitor C2, the third capacitance C3, the resistor R5 and the voltage divider 200, respectively.

The current determining circuit may be configured to determine the current IAC of the alternating signal according to Kirchhoffs current law applied to the current flowing through at least one electronic device and the current IDC of the rectified signal. Kirchhoffs current law may be applied to all nodes of the circuit arrangement 100 necessary for determining or calculating the alternating current IAC.

For example, referring to FIG. 2, in case the alternating voltage VAC at input 104 is positive with respect to input 105, current may flow through the third diode D3 and the second diode D2, while the first diode D1 and the fourth diode D4 may block current (ID1=ID4=0). The following equations may then be derived by applying Kirchhoffs current law $$\text{at node 4: } IAC = IVD + IL1 + IC1 \quad (11)$$

$$\text{at node 5: } IL1 = IC2 + ID3 \quad (12)$$

$$\text{at node 9: } ID3 = IC3 + IDC \quad (13)$$

Substituting Eq. (13) in Eq. (12) and then substituting Eq. (12) in Eq. (11), and rearranging gives:

$$IAC = IVD + IC1 + IC2 + IC3 + IDC \quad (14)$$

Substituting Eqs. (5) to (10) in Eq. (14) gives:

$$IAC = VVD/(2*R2) + C1*d(VC1)/dt + \\ C2*d(VC2)/dt + C3*d(VC3)/dt + VR5/R5 \quad (15)$$

Given the knowledge of R2, C1, C2, C3, and R5, the alternating current IAC may be determined from measurements of VVD, VC1, VC2, VC3 and VR5 by performing the mathematical operations in Eq. (15).

It may not be necessary to measure all the voltage necessary for determining or calculating the alternating current if one or more of them can be approximated and the error introduced by the approximation is negligible.

For example, VC1 can be approximated by $$VC1 = VAC = KVD*VVD \quad (16)$$

since VC1 is equal to VAC because of the circuit topology.

For example, VC2 can be approximated by $$VC2 = VAC = KVD*VVD \quad (17)$$

since VC2 differs from VC1 only by the voltage drops on the inductors L1 and L2. The inductors L1 and L2 are part of an electromagnetic interference filter (EMI) filter and are designed so that their voltage drops at the filter working point frequency, for example 50-60 Hz, are negligible.

For example, VC3 can be approximated by $$VC3 = VAC = KVD*VVD \quad (18)$$

since VC3 differs from VC2 only by the voltage drops across diodes D3, D2 or D1, D4. These voltage drops may approximately be equal to 1.4 V. The error introduced may be proportional to 1.4/220 for 220 V main voltage, for example in European like markets and may be proportional to 1.4/120 for 120 V main voltage, for example in US like markets. In the worst case, for 120 V main voltage, the error is less than 1.2% which is reduced even more by multiplying it with the capacitance value.

With the above approximations, only VVD and VR5 need to be measured for the calculation of the alternating current IAC according to Eq. (15).

Eq. (14) is also valid when the alternating voltage VAC at input 104 is negative with respect to input 105 and current flows through the fourth diode D4 and the first diode D1, while the second diode D2 and the third diode D3 are blocking current (ID2=ID3=0).

Eq. (14) may be modified, depending on the topology or circuit structure of the circuit arrangement 100. For example, if the current IVD flowing through the voltage divider 200 may be the neglected, the alternating current IAC may be calculated by $$IAC = IC1 + IC2 + IC3 + IDC \quad (19).$$

As another example, if there is no voltage divider 200 and no filter 202, the alternating current IAC may be calculated by $$IAC = IC3 + IDC \quad (20).$$

Eq. (14) may also be modified to include electronic devices in the power factor correction unit 112.

As Kirchhoff's current law are used for calculating the alternating current IAC, electronic devices in series with other electronic devices do not need to appear in the equations. In this way, modeling electrical devices which are more difficult to model may be avoided. For example, no model of a diode D1 to D4 is needed.

Alternatively to calculating the alternating current IAC using mathematical operations, a current entry may be stored in a table for each voltage measured for each electronic device. For example, for Eq. (14), such a table may have current entries corresponding to voltage entries for the voltage divider 200 and the resistor R5. For electronic devices in which the current through the electronic device depends on the rate of change of the voltage across the electronic device with time, for example the first capacitor C1, the second capacitor C2 and the third capacitor C3, a rate of change of the voltage over time may need to be measured or calculated and may be stored in the table with the corresponding current flowing through the electronic device.

Returning to FIG. 3, the current determining circuit 108 may have a branch for each current in the rectifier circuit 102 that needs to be determined to calculate the alternating current IAC. For example, the current determining circuit 108 may have branches A, B, C, D and E for determining IVD, IC1, IC2, IC3 and IDC, respectively, which are used according to the Eq. (15) to calculate IAC.

The current determining circuit 108 may include analog-to-digital converters (ADC) 300. The analog-to-digital converters 300 may convert an analog voltage, for example VC1, VC2, VC3, VR5, or VVD, into a discrete or digital form. Determining the alternating current IAC, for example by means of Eq. (15), may be easier when the voltages are in digital form.

The current determining circuit 108 may include differentiating elements 302. The differentiating element 302 may output a derivative of an input value with respect to time. It may be used in calculating the current through a capacitor when the voltage across the capacitor is known or may be measured.

The current determining circuit 108 may include further elements that are needed to relate the current flowing through an electronic device to the voltage across the electronic device. Such elements may for example be adding elements, subtracting elements, integrating elements, logarithmic elements or exponential elements. An integrating element may integrate a value and may for example be used to determine or calculate the current flowing through an inductor when the voltage across the inductor is known or may be measured. An exponential element may return an exponential of a value with respect to base e, where e is Euler number e=2.71828 . . . . It may for example be used to determine or calculate the current flowing through a diode when the voltage across the diode is known or may be measured, for example using the formulae I=I0*(exp(U/UT)−1). A subtracting element may be used to subtract an offset. Any element that is required for determining the current through any electronic device from a voltage across the electronic device may be present in the current determining circuit 108.

The current determining circuit 108 may further include multiplying elements 304. A multiplying element 304 may multiply a value, for example a voltage, a derivative, an integral, or an exponential with another value, for example a voltage, a parameter of an electronic device, a constant or the like. The multiplying element 304 may multiply a value by a negative number, for example −1. This may be useful if a current has an opposite direction to the direction in which it was determined.

In the case of a capacitor, the multiplying element 304 may multiply the derivative calculated by the differentiating element 302 with the capacitance of the capacitor to determine the current flowing through the capacitor. As an example, IC1=C1*d(VC1)/dt for the first capacitor C1.

In the case of a resistor, the multiplying element 304 may multiply the inverse of the resistance of the resistor with the voltage across the resistor to determine the current flowing through the resistor. As an example, IR5=1/R5*VR5 for the fifth resistor R5.

In the case of a voltage divider, the multiplying element 304 may multiply the voltage output by the voltage divider by a factor of the voltage divider to determine the voltage across the voltage divider. As an example, VAC=KVD*VVD with KVD=(R1+R2)/R2 for the voltage divider shown in FIG. 2. Similarly, a current flowing through a voltage divider may be calculated by multiplying the inverse of the resistance between its outputs by the voltage output of the voltage divider by the multiplying element 304. For example, IVD=1/(2*R2)*VVD for the voltage divider shown in FIG. 2.

The multiplying elements 304 may be located in different locations with respect to other elements used for determining the current if the operations performed are commutative. For example, the multiplying element 304 may be placed before the differentiating element 302 without affecting the calculation of the current IC1 since IC1=C1*d(VC1)/dt is commutative to IC1=d(C1*VC1)/dt.

The current determining circuit 108 may have an adding element 306. The adding element 306 may add the currents determined in each branch in order to obtain the alternating current IAC according to Kirchhoff's current law. For example, the adding element 306 may add the currents IVD, IC1, IC2, IC3 and IDC to obtain the alternating current IAC according to Eq. (15).

The values IAC and VAC may be further processed by the current determining circuit 108, for example to obtain power metrics. The current determining circuit 108 may be configured to calculate at least one of the following metrics: an active power, a reactive power, an apparent power, a power factor, a phase angle, a voltage root mean square, a current root mean square, a crest factor, a distortion power, a harmonic content of voltage, a harmonic content of current, and a total harmonic distortion. The current determining circuit 108 may include means to determine a zero-crossing of a signal and may include means to determine a period of a signal. The above metrics may be calculated for the alternating signal, for certain frequency components, such as the fundamental or first harmonic of the alternating signal, or for any other signal in the circuit arrangement 100.

As an example, the alternating current IAC and the alternating voltage VAC may be multiplied by a multiplying element 304 to obtain the total apparent power S. For example, a current root mean square may be calculated by the RMS element 310, which may square the values of IAC, find the mean of the squared values and calculate the square root. The current determining circuit 108 may contain low pass filters 314 which may be used for calculating the first harmonic or fundamental component IAC_F of the alternating current IAC or the first harmonic or fundamental component VAC_F of the alternating voltage VAC. The first harmonic IAC_F of the alternating current IAC and the first harmonic VAC_F of the alternating voltage may be multiplied by a multiplying element 304 to obtain the apparent power of the first harmonic or fundamental component S_F. The apparent power of the first harmonic S_F may be subtracted from the total apparent power S to obtain S−S_F. The subtraction may be implemented by multiplying the apparent power of the first harmonic S_F by −1 by means of a multiplying element 304 and adding the result to the total apparent power S by an adding element 306. The current determining circuit 108 may contain an inverting element 316. The inverting element 300 and may invert the apparent power of the first harmonic S_F to obtain its inverse 1/S_F. To obtain the total harmonic distortion (THD), the current determining circuit 108 may multiply the inverse of the apparent power of the first harmonic 1/S_F by the difference between the total apparent power S and the apparent power of the first harmonic S_F by means of a multiplying element 304.

An active power, a reactive power, a power factor, a phase angle, a crest factor, etc., may also be calculated according to respective formulae and may be implemented in a similar way as outlined above.

One or more of the calculated values may be converted into an analog form by a digital-to-analog converter (DAC). For example, the apparent power S may be converted by a digital-to-analog converter 318 into an analog signal Sa. In the field of energy measurement, the calculated values may be converted to pulses. The frequency of the pulses may be proportional to the calculated power, which may for example be an active power, a reactive power or an apparent power. A single pulse may correspond to a given amount of energy, for example 3600 Wh.

The current determining circuit 108 may include programmable logic circuit. The programmable logic circuit may, for example, be a microcontroller, a digital signal processor (DSP), an application specific integrated circuit (ASIC) or a field programmable gate array (FPGA). The programmable logic circuit may be programmed to perform some or all of the operations required for calculating the alternating current IAC. For example, the programmable logic circuit may be programmed to perform the operations described in conjunction with FIG. 3.

While the current determining circuit 108 shown in FIG. 3 is implemented using digital operations, the operations listed above may also be implemented using analog circuitry. For example, the differentiating element 302 may be an analog differentiator, for example using an operating amplifier with a capacitor. Similarly, the multiplying element 304 may be an analog multiplier, for example using the Hall effect or an operational amplifier with a diode.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a rectifier circuit configured to rectify an alternating signal into a rectified signal; and
a current determining circuit configured to determine a current of the alternating signal from at least a current of the rectified signal; wherein the current determining circuit is configured to determine a current flowing through at least one electronic device using a measured voltage across the at least one electronic device and a model of the at least one electronic device.

2. The circuit arrangement according to claim 1,
wherein the current determining circuit is configured to determine a current of a signal at an input of the rectifier circuit based on a current determined at an output of the rectifier circuit.

3. The circuit arrangement according to claim 1,
wherein the current determining circuit is configured to determine the current of the alternating signal according to Kirchhoff's current law applied to the current flowing through the at least one electronic device and the current of the rectified signal.

4. The circuit arrangement according to claim 1,
wherein the model of the electronic device comprises an equivalent circuit of the device.

5. The circuit arrangement according to claim 4,
wherein the equivalent circuit of the device further comprises elements describing at least one of:
a parasitic effect;
a frequency dependence; and
a temperature dependence.

6. The circuit arrangement according to claim 4, further comprising
a memory configured to store at least one parameter of the equivalent circuit.

7. The circuit arrangement according to claim 1, further comprising
a look-up-table configured to store at least one current value corresponding to a voltage value, wherein the current is a current flowing through an electronic device in the circuit arrangement and the voltage value is a voltage across the electronic device.

8. The circuit arrangement according to claim 1,
wherein the at least one electronic device comprises a filter to suppress electromagnetic interference between the alternating signal and the rectified signal.

9. The circuit arrangement according to claim 1,
wherein the at least one electronic device comprises a capacitor to smoothen the rectified signal.

10. The circuit arrangement according to claim 1,
wherein the rectifier circuit is configured as a full-wave rectifier.

11. The circuit arrangement according to claim 1, further comprising:
a voltage measuring circuit configured to measure a voltage of the alternating signal.

12. The circuit arrangement according to claim 1, further comprising:
wherein the current determining circuit comprises a programmable logic circuit.

13. The circuit arrangement according to claim 1,
wherein the current determining circuit is configured to calculate at least one of:
an active power of the alternating signal;
a reactive power of the alternating signal;
an apparent power of the alternating signal;
a power factor of the alternating signal;
a phase angle of the alternating signal;
a voltage root mean square of the alternating signal;
a current root mean square of the alternating signal;
a crest factor of the alternating signal;
a distortion power of the alternating signal;
a harmonic content of voltage of the alternating signal;
a harmonic content of current of the alternating signal; and
a total harmonic distortion of the alternating signal.

14. The circuit arrangement according to claim 1, further comprising:
a power factor correction circuit configured to provide a power factor correction.

15. A method for determining a current in a circuit arrangement, the method comprising:
rectifying an alternating signal into a rectified signal;

determining a current associated with the rectified signal by determining a current flowing through at least one electronic device in the circuit arrangement using a measured voltage across the at least one electronic device and a model of the at least one electronic device; and determining an alternating current by using a circuit topology of the circuit arrangement and the current associated with the rectified signal.

16. The method according to claim 15, wherein determining the alternating current using circuit topology comprises applying Kirchhoff's current law to the circuit arrangement.

17. The method according to claim 16, wherein applying Kirchhoff's current law comprises measuring a voltage over at least one electronic device; and determining a current through the electronic device by looking up a previously determined current value corresponding to the measured voltage.

18. The method according to claim 15, further comprising using the alternating current to calculate at least one of:
  an active power of the alternating signal;
  a reactive power of the alternating signal;
  an apparent power of the alternating signal;
  a power factor of the alternating signal;
  a phase angle of the alternating signal;
  a voltage root mean square of the alternating signal;
  a current root mean square of the alternating signal;
  a crest factor of the alternating signal;
  a distortion power of the alternating signal;
  a harmonic content of voltage of the alternating signal;
  a harmonic content of current of the alternating signal; and
  a total harmonic distortion of the alternating signal.

19. The method according to claim 15, wherein the current through the electronic device is determined by means of a programmable logic circuit.

* * * * *